United States Patent
Zhang et al.

(10) Patent No.: US 10,233,846 B2
(45) Date of Patent: Mar. 19, 2019

(54) SMART LIQUID FUEL SYSTEM WITH ABILITY TO SELF-DIAGNOSTICS

(71) Applicant: GENERAL ELECTRIC COMPANY, Schenectady, NY (US)

(72) Inventors: Hua Zhang, Greenville, SC (US); Manuel Cardenas, Jr., Greenville, SC (US); David Trayhan, Greenville, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 249 days.

(21) Appl. No.: 15/270,612

(22) Filed: Sep. 20, 2016

(65) Prior Publication Data

US 2018/0080390 A1    Mar. 22, 2018

(51) Int. Cl.
*F23R 3/28* (2006.01)
*F02C 9/28* (2006.01)
(Continued)

(52) U.S. Cl.
CPC ............... *F02C 9/28* (2013.01); *F02C 9/40* (2013.01); *G05B 13/041* (2013.01); *G05B 17/02* (2013.01);
(Continued)

(58) Field of Classification Search
CPC .. F02D 41/30; F02C 9/28; F02C 7/228; F02C 9/00; F02C 7/236; F02C 3/22; F01D 21/003
See application file for complete search history.

(56) References Cited

U.S. PATENT DOCUMENTS

| | | | | |
|---|---|---|---|---|
| 3,738,104 A | * | 6/1973 | Rosa | F02C 7/228 137/115.21 |
| 4,328,824 A | * | 5/1982 | Kiernan | F02C 7/228 137/99 |

(Continued)

FOREIGN PATENT DOCUMENTS

EP    2 570 616 A2    3/2013

OTHER PUBLICATIONS

Extended European Search Report and Opinion issued in connection with corresponding EP Application No. 17190799.1 dated Feb. 13, 2018.

(Continued)

*Primary Examiner* — Kandasamy Thangavelu
(74) *Attorney, Agent, or Firm* — Fletcher Yoder, P.C.

(57) ABSTRACT

A system for predicting performance of a liquid fuel system includes a processor and a memory communicatively coupled to the processor, wherein the memory stores instructions which when executed by the processor perform operations. The operations include establishing a baseline parameter for at least one physical parameter of a nozzle or a valve associated with at least one combustor of the liquid fuel system with at least one time. The operations also include obtaining one or more operational parameters associated with the liquid fuel system from one or more sensors during operation of a gas turbine engine. The operations further include utilizing an operational model of a fuel flow divider to output an action associated with the liquid fuel system based at least on the baseline parameter and the one or more operational parameters.

20 Claims, 4 Drawing Sheets

(51) Int. Cl.
*G05B 17/02* (2006.01)
*G06F 17/50* (2006.01)
*F02C 9/40* (2006.01)
*G05B 13/04* (2006.01)
*G05B 23/02* (2006.01)

(52) U.S. Cl.
CPC ..... *G05B 23/0294* (2013.01); *G06F 17/5009* (2013.01); *F05D 2220/32* (2013.01); *F05D 2270/07* (2013.01); *F05D 2270/301* (2013.01); *F05D 2270/303* (2013.01); *F05D 2270/44* (2013.01); *F05D 2270/71* (2013.01)

(56) References Cited

U.S. PATENT DOCUMENTS

| | | | |
|---|---|---|---|
| 7,891,192 | B2 | 2/2011 | Myers et al. |
| 2005/0107942 | A1 | 5/2005 | Nomura et al. |
| 2008/0098746 | A1* | 5/2008 | Iasillo ............... F02C 3/22 60/776 |
| 2008/0178600 | A1 | 7/2008 | Healy et al. |
| 2013/0068307 | A1* | 3/2013 | Hains ............... F02C 7/236 137/1 |
| 2014/0018973 | A1* | 1/2014 | Drohan ............... F02C 9/00 700/300 |
| 2014/0165530 | A1 | 6/2014 | Stutz et al. |
| 2015/0007574 | A1 | 1/2015 | Morgan et al. |
| 2015/0160096 | A1 | 6/2015 | Patrick et al. |
| 2015/0226129 | A1 | 8/2015 | Byrd et al. |
| 2015/0308915 | A1 | 10/2015 | Konatham et al. |
| 2016/0326967 | A1* | 11/2016 | Yamamoto ............... F02C 9/28 |
| 2017/0292457 | A1* | 10/2017 | Selstad ............... F01D 21/003 |
| 2017/0328567 | A1* | 11/2017 | Crowley ............... F02D 41/30 |

OTHER PUBLICATIONS

Tomi R. Krogerus et al., "A survey of analysis, modeling, and diagnostics of diesel fuel injection systems", Journal of Engineering for Gas Turbines and Power, Aug. 2016, vol. 138, http://gasturbinespower.asmedigitalcollection.asme.org/journal.aspx.

Gabor J. Tamasy, (1997),"Smart sensor networks for robotic sensor skins", Sensor Review, vol. 17 Iss 3 pp. 232-239, Permanent link to this document: http://dx.doi.org/10.1108/02602289710172364.

Xiao Liu et al., A Survey on Gas Sensing Technology, Sensors 2012, 12, 9635-9665; www.mdpi.com/journal/sensors.

U.S. Appl. No. 15/012,376, filed Feb. 1, 2016, Zhang Hua.

* cited by examiner

SMART LIQUID FUEL SYSTEM WITH ABILITY TO SELF-DIAGNOSTICS

BACKGROUND

The present disclosure relates generally to power generation systems. In particular, the present disclosure relates to an operational model for a liquid fuel system.

A dual-fuel combustion system can burn both gaseous fuel and liquid fuel. Typically, a dual-fuel turbine system operates using the gaseous fuel, and the liquid fuel is used as a backup fuel when the gaseous fuel is not available. During operation on gaseous fuel, the liquid fuel system is non-operational but may be remain filled with a stagnant volume of distillate liquid fuel. Under those conditions, corrosions and/or particle built-up can form along the surfaces of the liquid fuel system (e.g., in the flow divider, fuel nozzles, valves, etc.), which may cause erosion/corrosion of the flow divider, clogged valves, clogged nozzles, etc. These conditions may go unnoticed and result in decreased productivity and reliability of the combustion fuel system. While sensors may be installed to monitor certain parameters of the liquid fuel system, it is difficult for an operator to estimate the real situation of the liquid fuel system for planned power generation operations. As such, a predictive and self-diagnostic model of the liquid fuel system integrated with the power generation system may be desirable.

BRIEF DESCRIPTION

Certain embodiments commensurate in scope with the originally claimed subject matter are summarized below. These embodiments are not intended to limit the scope of the claimed embodiments, but rather these embodiments are intended only to provide a brief summary of possible forms of the subject matter. Indeed, the presently claimed embodiments may encompass a variety of forms that may be similar to or different from the embodiments set forth below.

In a first embodiment, a system for predicting performance of a liquid fuel system includes a processor and a memory communicatively coupled to the processor, wherein the memory stores instructions which when executed by the processor perform operations. The operations include establishing a baseline parameter for at least one physical parameter of a nozzle or a valve associated with at least one combustor of the liquid fuel system with at least one time. The operations also include obtaining one or more operational parameters associated with the liquid fuel system from one or more sensors during operation of a gas turbine engine. The operations further include utilizing an operational model of a fuel flow divider to output an action associated with the liquid fuel system based at least on the baseline parameter and the one or more operational parameters.

In a second embodiment, a system for predicting performance of a liquid fuel system includes a gas turbine engine comprising a plurality of combustors and associated fuel nozzles, a fuel flow divider configured to regulate fuel flow to the associated fuel nozzles, a processor, and a memory communicatively coupled to the processor. The memory stores instructions which when executed by the processor perform operations including establishing a baseline parameter for at least one physical parameter of a respective nozzle or a respective valve associated with each combustor of the plurality combustors of the liquid fuel system with at least one time. The operations also include obtaining one or more operational parameters associated with the liquid fuel system from one or more sensors during operation of the gas turbine engine. The operations further include utilizing an operational model of the fuel flow divider to output an action associated with the liquid fuel system based at least on the baseline parameter and the one or more operational parameters.

In a third embodiment, a non-transitory computer-readable medium has computer executable code stored thereon. The code includes instructions for establishing a baseline parameter for at least one physical parameter of a nozzle or a valve associated with at least one combustor of the liquid fuel system with at least one time. The code also includes obtaining one or more operational parameters associated with the liquid fuel system from one or more sensors during operation of a gas turbine engine. The code further includes utilizing an operational model of a fuel flow divider to output an action associated with the liquid fuel system based at least on the baseline parameter and the one or more operational parameters.

BRIEF DESCRIPTION OF THE DRAWINGS

These and other features, aspects, and advantages of the presently disclosed techniques will become better understood when the following detailed description is read with reference to the accompanying drawings in which like characters represent like parts throughout the drawings, wherein.

DETAILED DESCRIPTION

Figure 1:
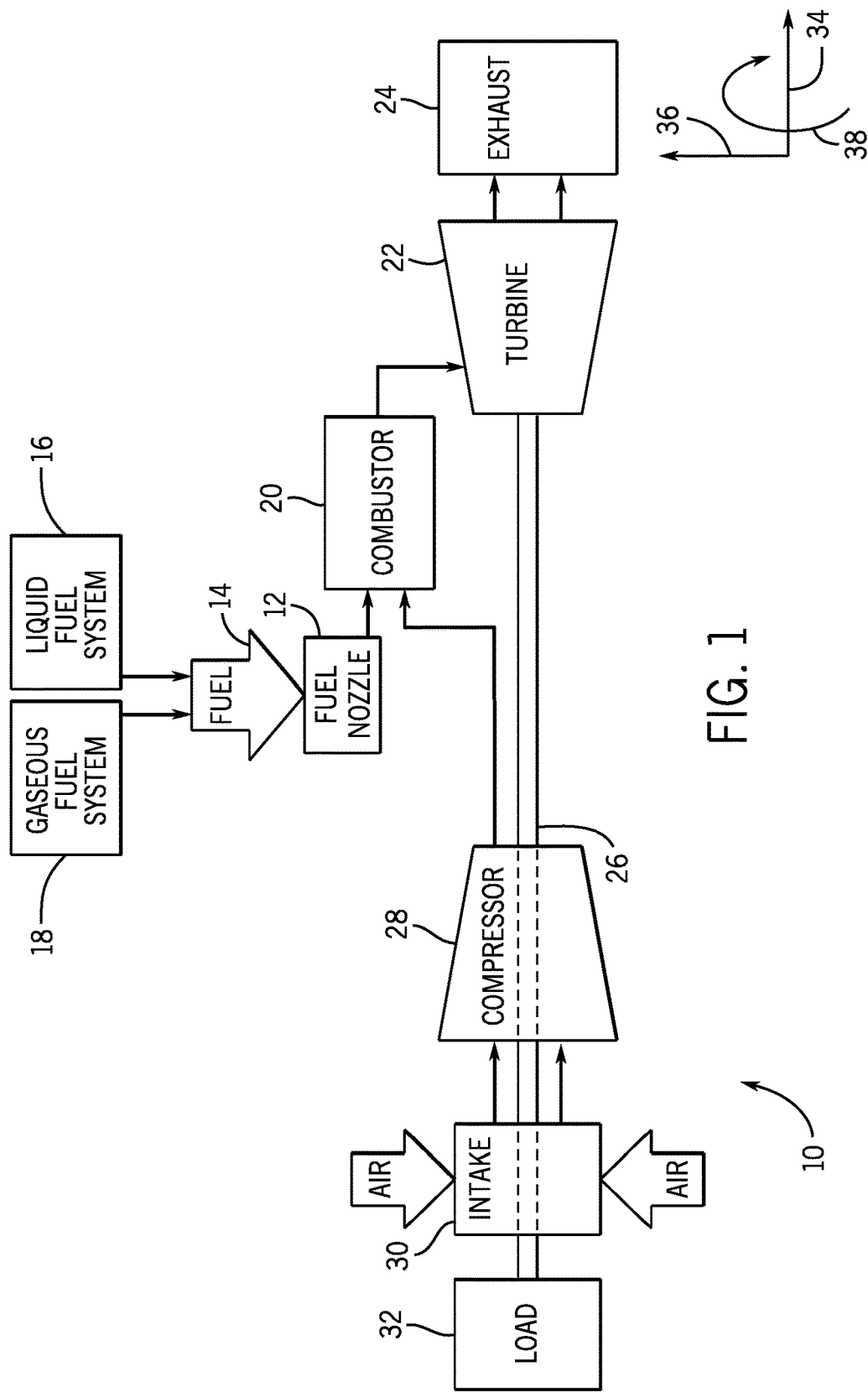
FIG. 1 is a schematic illustration of a turbine system, in accordance with an embodiment.

One or more specific embodiments of the presently disclosed embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the presently disclosed embodiments, the articles "a," "an," "the," and "said" are intended to mean that there are one or more of the elements. The terms "comprising," "including," and "having" are intended to be inclusive and mean that there may be additional elements other than the listed elements.

As described below, model (e.g., operational model of fuel flow divider) may be developed to make diagnostics on the overall health of a liquid fuel system for a power generation system and make probability prediction of successful liquid fuel startup. The model may be updated and trained overtime to make more accurate diagnostics and predictions. The model for the liquid fuel system may be connected to a service platform (e.g., cloud computing service, distributed control system, etc.) to generate diagnostic/performance prediction reports, maintenance recommendations, and operation adjustments periodically. The model may be developed and updated based on parameters/conditions collected during operation of the power generation system, including but not limited to fuel composition, fuel cleanness, operation duration, and various operation data of the liquid fuel and power generation systems (fuel flow rate, fuel pump pressure, temperatures, power output, compress mass flow rate, etc.). In addition, correlation functions may be established between various parameters. For example, a correlation may be established for fuel flow rate and exhaust spread temperature. In one embodiment, a system for predicting performance of a liquid fuel system includes a processor and a memory communicatively coupled to the processor, wherein the memory stores instructions which when executed by the processor perform operations. The operations include establishing a baseline parameter for at least one physical parameter of a nozzle or a valve associated with at least one combustor of the liquid fuel system with at least one time. The operations also include obtaining one or more operational parameters associated with the liquid fuel system from one or more sensors during different operation modes of a gas turbine engine. The said operation modes include part load and base load. The operations further include utilizing an operational model of a fuel flow divider to output an action associated with the liquid fuel system based at least on the baseline parameter and the one or more operational parameters. As such, the model for the liquid fuel system with ability to self-diagnostics may be integrated into digital power plant to improve the power generation reliability and availability, and contribute to operation optimization and asset optimization.

FIG. 1 is a schematic of an embodiment of a turbine system 10. As described in detail below, the disclosed turbine system 10 (e.g., a gas turbine engine) may employ an end cover with fuel plenums, described below, which may improve fuel distribution and improve system durability, operability, and reliability. The turbine system (e.g., dual-fuel turbine system) 10 may use liquid or gas fuel, such as natural gas and/or a hydrogen rich synthetic gas, to drive the turbine system 10. As depicted, fuel nozzles 12 (e.g., multi-tube fuel nozzles) intake a fuel supply 14 from a liquid fuel system 16 or a gaseous fuel system 18, mix the fuel with an oxidant, such as air, oxygen, oxygen-enriched air, oxygen reduced air, or any combination thereof. Although the following discussion refers to the oxidant as the air, any suitable oxidant may be used with the disclosed embodiments. Once the fuel and air have been mixed, the fuel nozzles 12 distribute the fuel-air mixture into a plurality of combustors 20 in a suitable ratio for optimal combustion, emissions, fuel consumption, and power output. The turbine system 10 may include one or more fuel nozzles 12 located inside the plurality of combustors 20. The fuel-air mixture combusts in a chamber within each of the plurality of combustors 20, thereby creating hot pressurized exhaust gases. The plurality of combustors 20 direct the exhaust gases through a turbine 22 toward an exhaust outlet 24. As the exhaust gases pass through the turbine 22, the gases force turbine blades to rotate a shaft 26 along an axis of the turbine system 10. As illustrated, the shaft 26 may be connected to various components of the turbine system 10, including a compressor 28. The compressor 28 also includes blades coupled to the shaft 26. As the shaft 26 rotates, the blades within the compressor 28 also rotate, thereby compressing air from an air intake 30 through the compressor 28 and into the fuel nozzles 12 and/or the plurality of combustors 20. The shaft 26 may also be connected to a load 32, which may be a vehicle or a stationary load, such as an electrical generator in a power plant or a propeller on an aircraft, for example. The load 32 may include any suitable device capable of being powered by the rotational output of the turbine system 10. The turbine system 10 may extend along an axial axis or direction 34, a radial axis or direction 36 toward or away from the axis 30, and a circumferential axis or direction 38 around the axis 30. The fuel nozzle 12 may contain or connect with an end cover having fuel plenums, described below, which may improve fuel distribution by feeding fuel directly into fuel injectors, which may feed fuel into tubes where it premixes with air before being released to the plurality of combustors 20.

Figure 2:
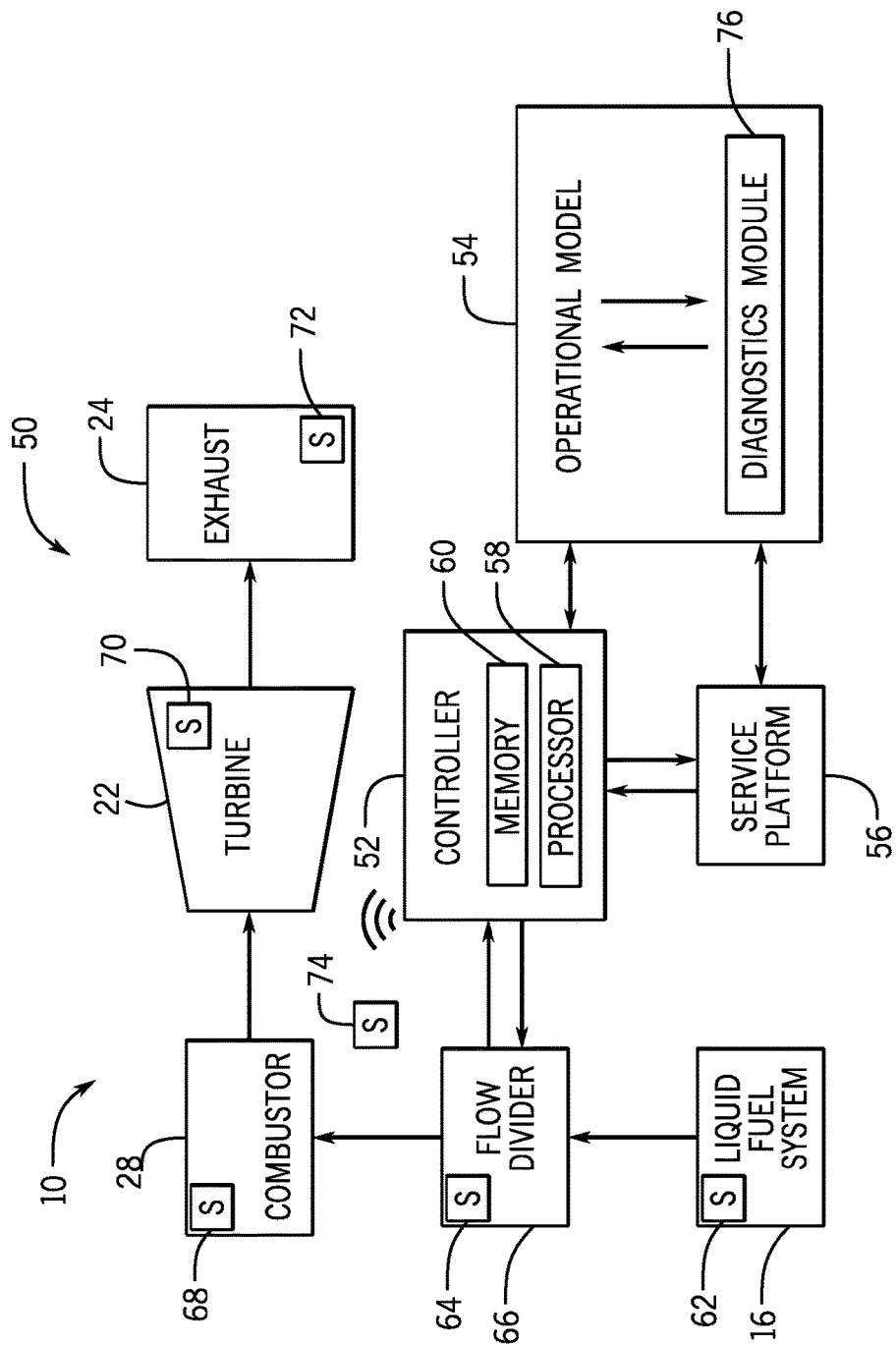
FIG. 2 is a block diagram illustrating a smart liquid fuel system for predicting the overall health of a liquid fuel system of the turbine system, in accordance with an embodiment of the present disclosure.

FIG. 2 is a block diagram illustrating a smart liquid fuel system 50 for predicting the overall health of the liquid fuel system 16 of the turbine system 10. The smart liquid fuel system 50 may include a controller 52, an operational model 54 (e.g., of the liquid fuel system 16 and of the fuel flow divider 66 in particular), and a service platform 56 (e.g., cloud computing service, distributed control system, etc.). The controller 52 is communicatively coupled (e.g., data transfer, receiving and giving instructions) with the service platform 56, the operational model 54, and various components and systems of the turbine system 10 (e.g., liquid fuel system 16, flow divider 66 configured to regulate fuel flow to the associated fuel nozzles 12, etc.) via wired or wireless network or communication system. In some embodiments, the controller 52 may be part of the service platform 56 (e.g., cloud computing service, distributed control system, etc.). The controller 52 has a processor 58 and a memory 60 (e.g., a non-transitory computer-readable medium/memory circuitry) communicatively coupled to the processor 58, storing one or more sets of instructions (e.g., processor-executable instructions) implemented to perform operations related to the liquid fuel system 16. More specifically, the memory 60 may include volatile memory, such as random access memory (RAM), and/or non-volatile memory, such as read-only memory (ROM), optical drives, hard disc drives, or solid-state drives. Additionally, the processor 58 may include one or more application specific integrated circuits (ASICs), one or more field programmable gate arrays (FPGAs), one or more general purpose processors, or any combination thereof. Furthermore, the term processor is not limited to just those integrated circuits referred to in the art as processors, but broadly refers to computers, processors, microcontrollers, microcomputers, programmable logic controllers, application specific integrated circuits, and other programmable circuits.

For example, the memory 60 may store instructions as to obtain information (e.g., physical parameters, operational parameters, operational conditions, etc.) from various components and systems of the turbine system 10 and the smart liquid fuel system 50, and store the obtained information in the memory 60. The information may be collected via one or more sensors 62 of the liquid fuel system 16, one or more sensors 64 of a flow divider 66, one or more sensors 68 of the plurality of combustors 20, one or more sensors 70 of the turbine 22, one or more sensors 72 of the exhaust 24, and one or more sensor 74 disposed in close proximity to the turbine system 10. In addition, the information may also be inputted by operators or users (e.g., via the controller 52 and/or via the service platform 56). For example, the one or more sensors 62, 64, 68, 70, 72, and 74 may include, but are not limited to temperature sensors (e.g., thermocouples, resistance temperature detectors or RTDs, surface acoustic wave sensors or SAWs, etc.), pressure sensors (e.g., pressure transducers, pressure transmitters, piezometers, pressure indicators, manometers, etc.), gas sensors (e.g., infrared point sensors, ultrasonic sensors, electrochemical gas sensors, semiconductor sensors, electrochemical sensors, SAWs, etc.), flow sensors (e.g., flow meters, thermal mass flow meters, ultrasonic flow meter, etc.), accelerometers (e.g., high temperature accelerometers), speed sensors (e.g., turbine speed sensors, magnetic speed sensors), position sensors, electrical current sensors, voltage sensors, and timers.

The operational model 54 is communicatively coupled with the controller 52 to output an action associated with the liquid fuel system 16. The operational model 54 may predict the performance of the liquid fuel system 16 (e.g., successful liquid fuel startup, failure of a specific component such as fuel valve, nozzle, or combustor, etc.), make recommendation for maintenance of a component of the liquid fuel system 16 (e.g., specific fuel nozzle, flow divider, valve, or combustor, etc.), and adjust an operation of one or more components of the liquid fuel system 16. Furthermore, the operational model 54 may include expert experiences, physics based models (e.g., to perform fluid flow simulations) and analytical models, a machine learning algorithm, an extrapolation model and so forth, such that the operational model 54 can be updated and trained over time to be smarter (e.g., more accurate predictions, better recommendations, etc.). Furthermore, the operational model 54 may include a diagnostics module 76, which may report current state of physical parameters of the liquid fuel system 16, report the overall health of the liquid fuel system 16, issue recommendations for maintenance, and/or issue or adjust an operation of one or more components of the liquid fuel system 16. For example the diagnostic module 76 may monitor and analyze the current operational conditions, parameters and data from the turbine system 10 and the liquid fuel system 16 (e.g., flow divider 66, nozzles 12, etc.), and compare the analyzed results with the historical records. The current operational conditions, parameters and data may also be analyzed and compared with the predictions of the operational model 54 and/or the expert experience. The diagnostics may be issued based on the comparison. In other embodiments, the diagnostic module 76 may also issue recommendations to adjust the operation conditions/parameters of the turbine system and the liquid fuel system 16 (e.g., flow divider 66, nozzles 12, etc.) based on comparison.

It may be appreciated that the diagnostic results issued by the diagnostic module 76 may also be fed back to the operational model 54 to update/train the operational model 54. In addition, the operational model 54, the diagnostics module 76, and all data included thereof may be stored in the memory 60 of the controller 52. In other embodiments, the operational model 54, the diagnostics module 76, and all data included thereof may be uploaded to the service platform 56 and stored in the service platform 56 (e.g., upon instructed by processor 58 of the controller 52). Authorized users may have access to the data, results/reports, the operational model 54, and the diagnostics module 76 through the service platform 56. Authorized users may also provide customer/user experiences and expert experiences through the service platform 56, and those information may be used to train/update the operational model 54. As such, the smart liquid fuel system 50 is integrated into digital power plant to operation optimization, and online diagnostics may be available to increase reliability and availability of the turbine system 10.

Figure 3:
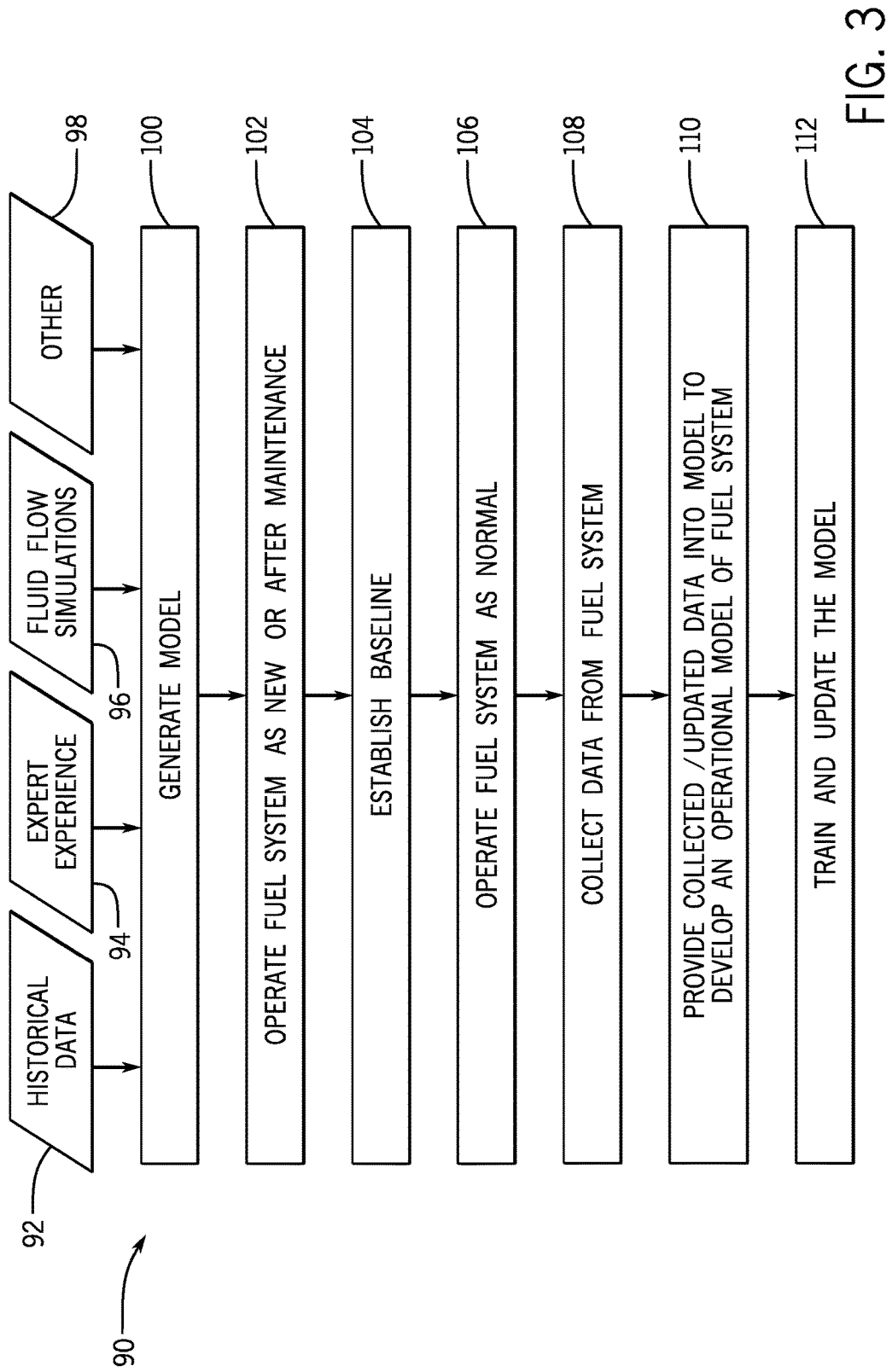
FIG. 3 is a flow chart illustrating a method for developing an operational model, in accordance with an embodiment of the present disclosure.

FIG. 3 is a flow chart illustrating a method 90 for developing the operational model 54. One or more of the steps of the method 90 may be executed by the controller 52. The method 90 includes adapting historical data 92, adapting expert experience 94, and incorporating fluid flow simulations 96 and other 98 (e.g., any relevant information, data, and user/operator inputs) for generating model (step 100), wherein the model generated at step 100 is an initial model of the operational model 54 that is subjected to further training/updating. The historical data may include but not limited to speed pickup of fuel flow divider, fuel flow rate, fuel composition, fuel flow divider pressure, differential pressure across oil filter, fuel pump pressure, pump motor speed, pump current, pump voltage, temperature upstream and downstream of the fuel flow divider, exhaust spread data, ambient temperature, control valve stroke, turbine speed, turbine compressor mass flow rate, position feedback of stop valve, a nozzle flow number, a flow coefficient ($C_v$), a flow capacity rating, number of hours of loaded operation, purge duration, expert experience, or a combination thereof. The expert experience may be any user or operator inputs related to operation of the liquid fuel system 16 and/or the turbine system 10. The method 90 also includes operating the fuel system as new or after maintenance (step 102) and establishing a baseline (step 104) (e.g., for at least one physical parameter of a nozzle or valve associated with at least one combustor) at a particular time (e.g., when the fuel system is new or after a maintenance). The data used for establishing the baseline of the operational model 54 (e.g., with baseline parameters) are data collected while the the liquid fuel system 16 is in operation right after a brand new flow divider 66 is newly installed or right after a major maintenance event of the liquid fuel system 16. Specifically, the baseline may be at least one baseline parameter for at least one physical parameter of a fuel nozzle 12 or a valve associated with at least one combustor 20 of the liquid fuel system 16. Specifically, the physical parameters may include a nozzle flow number, a flow coefficient ($C_v$), and a flow capacity rating, etc., for each individual combustor 20.

The method 90 also includes operating fuel system as normal (step 106) and collecting data from the fuel system (step 108) while the turbine system 10 operates using the liquid fuel system 16, and providing collected data into the model to develop the operational model 54 of fuel system (step 110). The collected data herein may be operational parameters associated with the liquid fuel system 16 and/or the turbine system 10 collected via sensors (e.g., sensors 62, 64, 68, 70, 72, and 74) during operation of the gas turbine system 10 or physical parameters of the gas turbine system 10. The operational parameters may include but not limited to speed pickup of fuel flow divider, fuel flow rate, fuel composition, fuel flow divider pressure, differential pressure across oil filter, fuel pump pressure, pump motor speed, pump current, pump voltage, temperature upstream and downstream of the fuel flow divider, exhaust spread data, ambient temperature, control valve stroke, turbine speed, turbine compressor mass flow rate, number of hours of loaded operation, and purge duration, gas turbine exhaust temperature spread at part load and base load, etc. The physical parameters may include but not limited to position feedback of stop valve, nozzle flow number, a flow coefficient ($C_v$), and a flow capacity rating, etc.

The operational model 54 may be developed based on data correlations between any of the physical or operational parameters set forth above. For example, a correlation may be established between a fuel flow rate and an exhaust spread. As a further example, a correlation may also be established between one or more physical parameters and one or more operational parameters. In addition, the operational model 54 may also be developed based on correlation between a variation in the one or more physical parameters to one or more operational parameters. Furthermore, the operational model 54 may be developed based additionally on operator/user input, and fluid flow simulations utilizing a physics based model that was created in system design phase.

The method 90 further includes training and updating the model (step 112). At this stage, the operational model 54 is operable to predict specific parameters, conditions, or changes in productivity of the liquid fuel system 16 based at least partially on data collected and correlations developed up to step 110 (e.g., steps 100 through step 110). For example, the operational model 54 may be able to predict parameters such as flow rate, fuel composition, pressure drop at the flow divider 66, etc. at a future time. For example, the operational model 54 may be able to predict conditions such as liquid fuel leakage, fuel cleanness, successful liquid fuel startup, etc. that may occur at a future time. The predictions made by the operational model 54 may be compared with the real situation/data for validation and training/updating of the operational model 54. In addition, the operational model 54 may also be trained and updated based on one or more physical or operational parameters set forth above.

Figure 4:
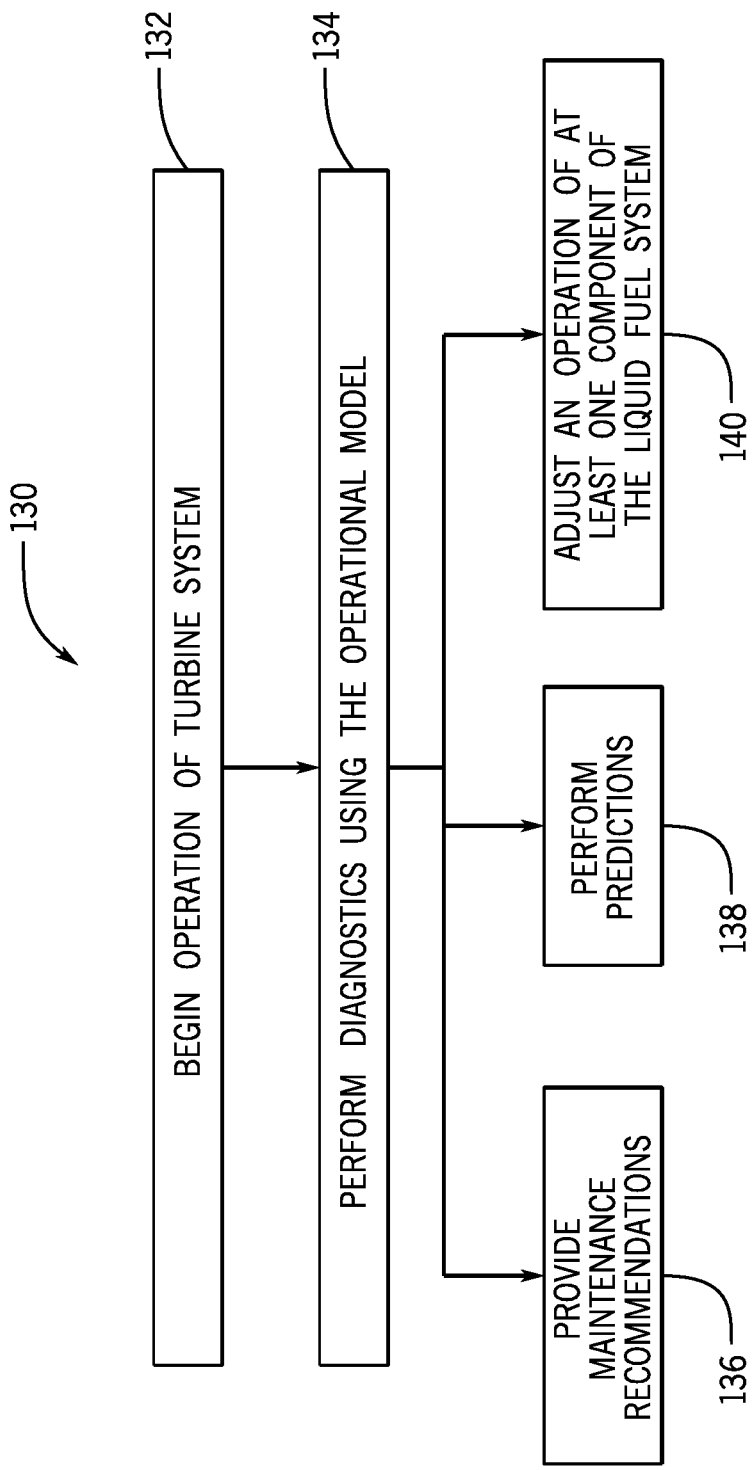
FIG. 4 is a flow chart illustrating a method for utilizing the operational model, in accordance with an embodiment of the present disclosure.

FIG. 4 is a flow chart illustrating a method 130 for utilizing the operational model 54. One or more of the steps of the method 130 may be executed by the controller 52. The method 130 includes beginning operation of the turbine system 10 (step 132), and performing diagnostics using the operational model 54 (step 134). Upon beginning operation of the turbine system 10, operation conditions and parameters (e.g., operational and physical parameters) may be fed into the operational model 54 in an in-situ or substantially in-situ manner, enabling the diagnostics module 76 issues diagnostics (e.g., reports, updates, etc.) of the overall health of the liquid fuel system 16. The diagnostics module 76 may determine that the gaseous fuel system 18 is not available, and the turbine system 10 can proceed to successful startup using the liquid fuel system 16. The diagnostics module 76 may also determine that the gaseous fuel system 18 is available, and the turbine system 10 can operate using only the gaseous fuel system 18. The diagnostics module 76 may advice the operator to transfer gaseous fuel system 18 to liquid fuel system 16 to operate turbine system 10, verse visa.

The method 130 also includes performing predictions (step 138), providing maintenance recommendations (step 136), and adjusting an operation of at least one component of the liquid fuel system 16 (step 140) using the operational model 54. Concurrent with the turbine operation, conditions and parameters are continuously fed into the operational model 54 to update the operational model 54 with the latest and concurrent conditions of the turbine system 10. Accordingly, the operational model 54 can predict the overall health state, the performance and/or specific parameters/conditions of the the liquid fuel system 16 at future times. For example, the operational model 54 may predict that particular component(s) of the liquid fuel system 16 (e.g., valves, nozzles, pumps, flow divider, etc.) may experience problems/issues in the future (e.g., in few days, weeks, months, or years). For example, the operational model 54 may predict a probability of successful liquid fuel startup if the turbine system 10 would operate using only the liquid fuel system 16 in the future (e.g., in few days, weeks, months, or years).

As mentioned, the operational model 54 may also be utilized for providing maintenance recommendations (step 136). For example, as the operational model 54 is communicatively coupled to the service platform 56 if it was predicted that certain components(s) such as valves, nozzles, pumps, flow divider, etc., may experience problems/issues after some time period (e.g., in few days, weeks, months, or years, etc.), the operational model 54 would issue maintenance recommendations (e.g., communicated through the service platform 56 to users/operators, etc.) to fix or replace the component(s) before the occurrence of the predicted issues/problems. In addition, the operational model 54 may be utilized for adjusting an operation of at least one component of the liquid fuel system (step 140). For example, the operational model 54 may predict that certain issues/problems have occurred and sending commends (e.g., through the service platform 56 and/or through the controller 52) to shut down the operation of the turbine system 10. The operational model 54 may also adjusting operation of any components of the fluid fuel system 16. For example, the operational model 54 may commend (e.g., commend signals sent through the service platform 56 and/or the controller 52) to increase or decrease the flow rate of the liquid fuel as to decrease the exhaust temperature spread of the turbine system 10.

This written description uses examples to describe the present embodiments, including the best mode, and also to enable any person skilled in the art to practice the presently disclosed embodiments, including making and using any devices or systems and performing any incorporated methods. The patentable scope of the presently disclosed embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system for predicting performance of a liquid fuel system, comprising:
   a processor;
   a memory communicatively coupled to the processor, wherein the memory stores instructions which when executed by the processor perform operations comprising:
   establishing a baseline parameter for at least one physical parameter of a nozzle or a valve associated with at least one combustor of the liquid fuel system with at least one time;
   obtaining one or more operational parameters associated with the liquid fuel system from one or more sensors during operation of a gas turbine engine;
   generating an operational model of a fuel flow divider based at least on the baseline parameter and the one or more operational parameters;
   utilizing the operational model of the fuel flow divider to predict the performance of the liquid fuel system; and
   utilizing the predicted performance of the liquid fuel system to generate a control command in a controller to adjust an operation of at least one component of the liquid fuel system and issue it to the component.

2. The system of claim 1, wherein the operations further comprise utilizing the predicted performance of the liquid fuel system to generate a recommendation for maintenance of a component of the liquid fuel system.

3. The system of claim 1, wherein the at least one time is associated with commissioning of the liquid fuel system.

4. The system of claim 1, wherein the at least one time is associated with a scheduled maintenance of the liquid fuel system.

5. The system of claim 1, wherein the instructions which when executed by the processor perform operations comprising generating the operational model of the fuel flow divider based on at least historical data.

6. The system of claim 5, wherein the historical data comprises speed pickup of fuel flow divider, fuel flow rate, fuel flow divider pressure, temperature upstream and downstream of the fuel flow divider, or number of hours of loaded operation, purge duration, or a combination thereof.

7. The system of claim 1, wherein the instructions which when executed by the processor perform operations comprising generating the operational model of the fuel flow divider based additionally on operator input, fluid flow simulations utilizing a physics based model, fuel composition, or differential pressure across oil filter, or a combination thereof.

8. The system of claim 1, wherein the one or more operational parameters comprise speed pickup of fuel flow divider, fuel flow rate, fuel flow divider pressure, temperature upstream and downstream of the fuel flow divider, exhaust spread data, or number of hours of loaded operation, purge duration, or a combination thereof.

9. The system of claim 1, wherein the instructions which when executed by the processor perform operations comprising updating the operational model of the fuel flow divider based on the one or more operational parameters.

10. The system of claim 1, wherein the instructions which when executed by the processor perform operations comprising utilizing the operational model of the fuel flow divider in correlating a fuel flow rate to an exhaust spread.

11. The system of claim 1, wherein the instructions which when executed by the processor perform operations comprising utilizing the operational model of the fuel flow divider in correlating a variation in the at least one physical parameter to the one or more operational parameters.

12. A system for predicting performance of a liquid fuel system, comprising:
a gas turbine engine comprising a plurality of combustors and associated fuel nozzles;
a fuel flow divider configured to regulate fuel flow to the associated fuel nozzles;
a processor;
a memory communicatively coupled to the processor, the memory storing instructions which when executed by the processor perform operations comprising:
establishing a baseline parameter for at least one physical parameter of a respective nozzle or a respective valve associated with each combustor of the plurality combustors of the liquid fuel system with at least one time;
obtaining one or more operational parameters associated with the liquid fuel system from one or more sensors during operation of the gas turbine engine;
generating an operational model of a fuel flow divider based at least on the baseline parameter and the one or more operational parameters;
utilizing the operational model of the fuel flow divider to predict the performance of the liquid fuel system; and
utilizing the predicted performance of the liquid fuel system to generate a control command in a controller to adjust an operation of at least one component of the liquid fuel system and issue it to the component.

13. The system of claim 12, wherein the at least one physical parameter comprises a nozzle flow number for the respective nozzle.

14. The system of claim 12, wherein the at least one physical parameter comprises a flow coefficient, $C_v$, for the respective valve.

15. The system of claim 12, wherein the instructions which when executed by the processor perform operations comprising utilizing the operational model of the fuel flow divider in correlating a variation in the at least one physical parameter to the one or more operational parameters.

16. The system of claim 12, wherein the at least one time is associated with commissioning of the liquid fuel system or a scheduled maintenance of the liquid fuel system.

17. The system of claim 12, wherein the instructions which when executed by the processor perform operations comprising updating the operational model of the fuel flow divider based on the one or more operational parameters.

18. The system of claim 12, wherein wherein the operations further comprise utilizing the predicted performance of the liquid fuel system to generate a recommendation for maintenance of a component of the liquid fuel system.

19. A non-transitory computer-readable medium having computer executable code stored thereon, the code comprising instructions for:
establishing a baseline parameter for at least one physical parameter of a nozzle or a valve associated with at least one combustor of the liquid fuel system with at least one time;
obtaining one or more operational parameters associated with the liquid fuel system from one or more sensors during operation of a gas turbine engine;
generating an operational model of a fuel flow divider based at least on the baseline parameter and the one or more operational parameters;
utilizing the operational model of the fuel flow divider to predict a performance of the liquid fuel system; and
utilizing the predicted performance of the liquid fuel system to generate a control command in a controller to adjust an operation of at least one component of the liquid fuel system and issue it to the component.

20. The non-transitory computer-readable medium of claim 19, wherein the code further comprises instructions for utilizing the predicted performance of the liquid fuel system to generate a recommendation for maintenance of a component of the liquid fuel system.

* * * * *